United States Patent
Asano (10) Patent No.: US 12,549,169 B2
(45) Date of Patent: Feb. 10, 2026

(54) DELAY CIRCUIT, DRIVE APPARATUS, SEMICONDUCTOR APPARATUS AND DELAY METHOD

(71) Applicant: FUJI ELECTRIC CO., LTD., Kanagawa (JP)

(72) Inventor: Taizo Asano, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 50 days.

(21) Appl. No.: 18/389,785

(22) Filed: Dec. 20, 2023

(65) Prior Publication Data

US 2024/0291473 A1    Aug. 29, 2024

(30) Foreign Application Priority Data

Feb. 24, 2023    (JP) .................................. 2023-027239

(51) Int. Cl.
| | |
|---|---|
| *H03K 5/134* | (2014.01) |
| *H03K 17/16* | (2006.01) |
| *H03K 17/687* | (2006.01) |
| *H03K 5/00* | (2006.01) |

(52) U.S. Cl.
CPC .......... *H03K 5/134* (2014.07); *H03K 17/162* (2013.01); *H03K 17/687* (2013.01); *H03K 2005/00058* (2013.01)

(58) Field of Classification Search
CPC .... H03K 5/134; H03K 17/162; H03K 17/687; H03K 2005/00058; H03K 17/28; H03K 17/567; H03K 2005/00019; H03K 17/284; H03K 2005/00247
See application file for complete search history.

(56) References Cited

U.S. PATENT DOCUMENTS

| | | | |
|---|---|---|---|
| 2003/0095365 A1* | 5/2003 | Nakatake | H03K 17/284 361/91.1 |
| 2013/0285732 A1 | 10/2013 | Mori | |
| 2019/0190369 A1 | 6/2019 | Nakamori | |

FOREIGN PATENT DOCUMENTS

| | | |
|---|---|---|
| JP | H10337037 A | 12/1998 |
| JP | 2013219633 A | 10/2013 |
| JP | 2019110677 A | 7/2019 |
| JP | 2022121267 A | 8/2022 |

\* cited by examiner

*Primary Examiner* — Jung Kim (57) ABSTRACT

Provided is a delay circuit which delays a control signal and outputs the control signal to a gate drive circuit of a semiconductor device, the delay circuit includes a delay unit which delays the control signal such that a time lag between a timing of change in the control signal and a timing of change in a drive signal supplied from the gate drive circuit to a gate of the semiconductor device is brought closer a predetermined reference period.

20 Claims, 7 Drawing Sheets

DELAY CIRCUIT, DRIVE APPARATUS, SEMICONDUCTOR APPARATUS AND DELAY METHOD

The contents of the following patent application(s) are incorporated herein by reference:
NO. 2023-027239 filed in JP on Feb. 24, 2023

BACKGROUND

1. Technical Field

The present invention relates to a delay circuit, a drive apparatus, a semiconductor apparatus, and a delay method.

2. Related Art

Conventionally known is a technique for reducing switching noises or switching losses by changing magnitude of current which drives a semiconductor device (for example, refer to Patent Documents 1 to 4).
Patent Document 1: Japanese Patent Application Publication No. 2013-219633
Patent Document 2: Japanese Patent Application Publication No. 2019-110677
Patent Document 3: Japanese Patent Application Publication No. 2022-121267
Patent Document 4: Japanese Patent Application Publication No. H10-337037

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are essential to the solution of the invention.

First Embodiment

Figure 1:
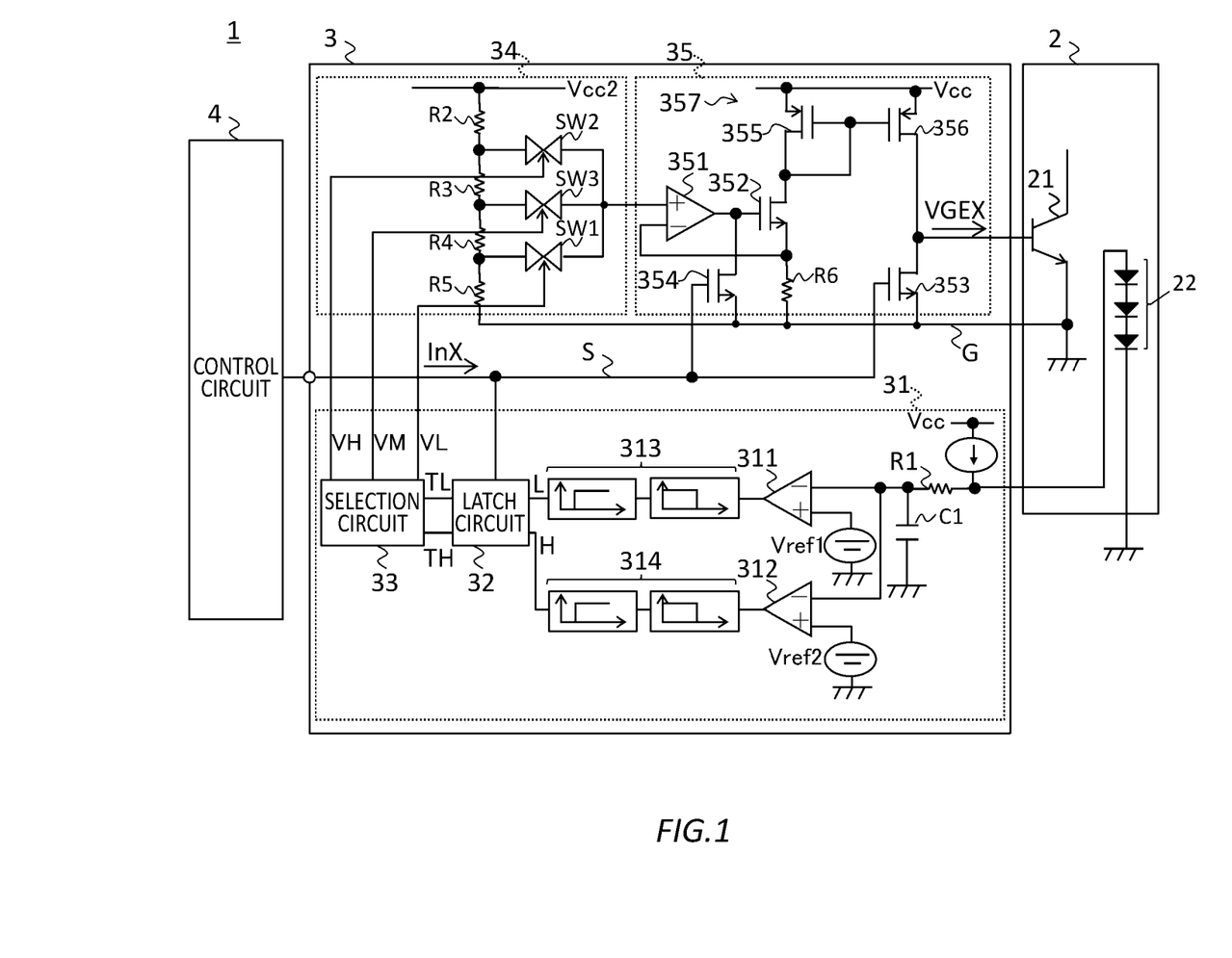
FIG. 1 illustrates a semiconductor apparatus 1 according to a first embodiment.

FIG. 1 illustrates a semiconductor apparatus 1 according to a first embodiment. The semiconductor apparatus 1 may be so-called an Intelligent Power Module (IPM) 1, and may be a power conversion apparatus adopted to a joint of an industrial robot, an elevator, a commercial air conditioner, etc. The semiconductor apparatus 1 includes a power semiconductor chip 2 and a drive apparatus 3. Note that, the semiconductor apparatus 1 that is the power conversion apparatus may include, for each arm thereof, the power semiconductor chip 2 and the drive apparatus 3, and by way of example, the present drawing illustrates the power semiconductor chip 2 for generating AC power for an X phase, and the drive apparatus 3.

The power semiconductor chip 2 may have an IGBT 21 and a diode 22. The IGBT 21 and the diode 22 may be formed in the same chip. The IGBT 21 is an example of a semiconductor device, and driven by a gate drive circuit 35 (to be described below) in the drive apparatus 3. The IGBT 21 may be turned on in response to a drive signal VGEX (by way of example, a gate voltage signal in the present embodiment) applied from the gate drive circuit 35 to a gate of the IGBT 21, and the IGBT 21 may supply a load (unillustrated) with constant power from a collector through an emitter. The emitter of the IGBT 21 may be connected also to a ground line G of the drive apparatus 3 (to be described below).

The diode 22 may be formed in, among regions of the power semiconductor chip 2, a region that is different from a region where the IGBT 21 is formed and that is suitable for detecting a temperature of the IGBT 21. An anode of the diode 22 may be connected to a power supply VCC and also connected to the drive apparatus 3, and a cathode of the diode 22 may be grounded. By way of example, in the present embodiment, multiple diodes 22 are provided in series in the power semiconductor chip 2, in a way that an anode of a diode 22 at one end is connected to the power supply VCC and also connected to the drive apparatus 3, and a cathode of a diode 22 at another end is grounded.

Voltage drop of the diode 22 may vary depending on a temperature of the power semiconductor chip 2 and, in turn, on an operating temperature of the IGBT 21. By way of example, in the present embodiment, the lower the operating temperature of the IGBT 21 is, the larger the voltage drop of the diode 22 may be, and the higher the operating temperature of the IGBT 21 is, the smaller the voltage drop of the diode 22 may be.

The drive apparatus 3 changes magnitude of current which drives the IGBT 21, depending on the operating temperature of the IGBT 21. The drive apparatus 3 may have a temperature detection unit 31, a switch unit 34, and the gate drive circuit 35.

The temperature detection unit 31 detects the operating temperature of the IGBT 21 by detecting and monitoring a voltage across the diode 22 (e.g., in the present embodiment, a voltage across the multiple diodes 22 connected in series). The temperature detection unit 31 includes a first comparator 311, a second comparator 312, a first filter circuit 313 connected to an output end of the first comparator 311, a second filter circuit 314 connected to an output end of the second comparator 312, a latch circuit 32, and a selection circuit 33.

The first comparator 311 has an inverting input terminal that may be connected to the anode of the diode 22, and a non-inverting input terminal that may be connected to a positive end of a reference voltage source Vref1. A negative end of the reference voltage source Vref1 may be grounded.

The second comparator 312 has an inverting input terminal that may be connected to the anode of the diode 22, and a non-inverting input terminal that may be connected to a positive end of a reference voltage source Vref2. A negative end of the reference voltage source Vref2 may be grounded.

A resistor R1 for device protection may be provided between the inverting input terminal of the first comparator 311 and the anode of the diode 22. Similarly, the resistor R1 may be provided between the inverting input terminal of the second comparator 312 and the anode of the diode 22. One end of a capacitor C1 may be connected between the inverting input terminal of the first comparator 311 and the resistor R1 in order to stabilize voltage that is detected from the both ends of the diode 22. Similarly, the one end of the capacitor C1 may be connected between the inverting input terminal of the second comparator 312 and the resistor R1 for the same reason as above. Another end of the capacitor C1 may be grounded.

The first comparator 311 may compare a value of the voltage across the diode 22 with a voltage value of the reference voltage source Vref1. Similarly, the second comparator 312 may compare the value of the voltage across the diode 22 with a voltage value of the reference voltage source Vref2. Then, the first comparator 311 and the second comparator 312 may respectively output H level output signals if the voltage values of the reference voltage sources Vref1 and Vref2 are larger, or output L level output signals if the value of the voltage across the diode 22 is larger.

In order to cover different operating temperature regions of the IGBT 21 with the output signals of the first comparator 311 and the second comparator 312, the voltage values of the reference voltage sources Vref1 and Vref2 may be set different from each other. The voltage value of the reference voltage source Vref1 may cover temperatures in one region among operating temperature regions of the IGBT 21, and the voltage value of the reference voltage source Vref2 may cover temperatures in a region different from that of the reference voltage source Vref1 among the operating temperature regions of the IGBT 21. By way of example, in the present embodiment, the reference voltage sources Vref1 and Vref2 are set to be Vref1>Vref2. In this way, the first comparator 311 may cover a cold region, and the second comparator 312 may cover a hot region.

Hereinafter, relationship between the operating temperatures of the IGBT 21 and output signals of the first comparator 311 and the second comparator 312 will be described. If the operating temperature of the IGBT 21 is low, the voltage drop of the diode 22 may be large when a constant current flows. Therefore, voltage values input to the inverting input terminals of the first comparator 311 and the second comparator 312 are larger than the voltage values of the reference voltage sources Vref1 and Vref2, which results in both of the first comparator 311 and the second comparator 312 outputting L level output signals.

If the operating temperature of the IGBT 21 is high, the voltage drop of the diode 22 may be small when a constant current flows. Therefore, voltage values input to the inverting input terminals of the first comparator 311 and the second comparator 312 are smaller than the voltage values of the reference voltage sources Vref1 and Vref2, which results in both of the first comparator 311 and the second comparator 312 outputting H level output signals.

If the operating temperature of the IGBT 21 is in the middle of these temperature ranges, the voltage drop of the diode 22 may be moderate when a constant current flows. Therefore, a voltage value input to the inverting input terminal of the first comparator 311 is smaller than a voltage value of the reference voltage source Vref1, which results in the first comparator 311 outputting an H level output signal. On the other hand, a voltage value input to the inverting input terminal of the second comparator 312 is larger than a voltage value of the reference voltage source Vref2, which results in the second comparator 312 outputting a L level output signal.

The first filter circuit 313 and the second filter circuit 314 may be digital filters which may apply predetermined delay to the output signals of the first comparator 311 and the second comparator 312 and thereby remove predetermined noise components in the output signals. The first filter circuit 313 has an input end that may be connected to an output terminal of the first comparator 311, and an output end that may be connected to an input end L (to be described below, and also referred to as a low-temperature side input end L) of the latch circuit 32. The second filter circuit 314 has an input end that may be connected to an output terminal of the second comparator 312, and an output end that may be connected to an input end H (to be described below, and also referred to as a high-temperature side input end H) of the latch circuit 32. Note that, in this drawing, the first filter circuit 313 and the second filter circuit 314 are composed of more than one orders, whereas any appropriate number of filter orders can be designed for achieving desired effects.

The latch circuit 32 detects change in a control signal InX (here, change to turn off the IGBT 21) from an external control circuit 4, and latches operating temperatures of the IGBT 21 detected by the first comparator 311 and the second comparator 312 at a timing when the IGBT 21 is OFF. The latch circuit 32 may have the low-temperature side input end L and the high-temperature side input end H, and a low-temperature side output end TL and a high-temperature side output end TH. The latch circuit 32 may retain a signal state input from the first filter circuit 313 to the low-temperature side input end L, and then output the signal state from the low-temperature side output end TL, and may retain a signal state input from the second filter circuit 314 to the high-temperature side input end H, and then output the signal state from the high-temperature side output end TH. Until the control signal InX (e.g., in the present embodiment, an H level signal) that causes the IGBT 21 to be turned off is supplied from the external control circuit 4 to the latch circuit 32 through a signal line S, the latch circuit 32 may retain states of the output signals from the first filter circuit 313 and the second filter circuit 314 which are taken at a timing when a last H level control signal InX is input to the latch circuit 32. That is, output of the latch circuit 32 may be fixed from when the IGBT 21 is once turned off until when the IGBT 21 is next turned off.

The selection circuit 33 supplies the switch unit 34 with a signal which selectively causes switches SW1 to SW3 (to be described below) in the switch unit 34 to be conductive depending on an output signal from the latch circuit 32. The selection circuit 33 may have three output ends VH, VM, and VL.

In response to both of the signals from the low-temperature side output end TL and the high-temperature side output end TH of the latch circuit 32 being at L level, the selection circuit 33 may output an H level signal from the output end VL, and L level signals from the output ends VM and VH. In this way, if the operating temperature of the IGBT 21 is low, the H level signal is output only from the output end VL, and the L level signals are output from the output ends VH and VM.

In response to both of the signals from the low-temperature side output end TL and the high-temperature side output end TH of the latch circuit 32 being at H level, the selection circuit 33 may output an H level signal from the output end VH, and L level signals from the output ends VL and VM. In this way, if the operating temperature of the IGBT 21 is high, the H level signal is output only from the output end VH, and the L level signals are output from the output ends VL and VM.

In response to a signal from the low-temperature side output end TL of the latch circuit 32 being at H level, and a signal from the high-temperature side output end TH of the latch circuit 32 being at L level, the selection circuit 33 may output an H level signal from the output end VM, and L level signals from the output ends VL and VH. In this way, if the operating temperature of the IGBT 21 is in the middle of the temperature ranges, the H level signal is output only from the output end VM, and the L level signals are output from the output ends VL and VH.

The switch unit 34 may include the three switches SW1 to SW3, and three resistors R2 to R4 connected in series and forming a resistor divider circuit, and a voltage source VCC2. The switch unit 34 may cause any of the switches SW1 to SW3 to be conductive depending on output from the selection circuit 33. One end of the resistor divider circuit formed of the resistors R2 to R4 may be connected to the voltage source VCC2, and another end may be connected to the ground line G through a resistor R5 and thereby grounded. The switches SW1 to SW3 may each be a CMOS switch in which an n-channel MOSFET and a p-channel MOSFET are connected in parallel, for example.

The switch SW1 has an input side that may be connected to the voltage source VCC2 through the resistors R2 to R4, and an output side that may be connected to a non-inverting input terminal of a differential amplifier 351 in the gate drive circuit 35 (to be described below). The switch SW1 may be connected to the output end VL of the selection circuit 33 such that the switch SW1 is made conductive when the output signals of both of the first comparator 311 and the second comparator 312 are at L level.

The switch SW2 has an input side that may be connected to the voltage source VCC2 through the resistor R2, and an output side that may be connected to the non-inverting input terminal of the differential amplifier 351. The switch SW2 may be connected to the output end VH of the selection circuit 33 such that the switch SW2 is made conductive when the output signals of both of the first comparator 311 and the second comparator 312 are at H level.

The switch SW3 has an input side that may be connected to the voltage source VCC2 through the resistors R2 to R3, and an output side that may be connected to the non-inverting input terminal of the differential amplifier 351. The switch SW3 may be connected to the output end VM of the selection circuit 33 such that the switch SW3 is made conductive when the output signal of the first comparator 311 is at H level, and the output signal of the second comparator 312 is at L level.

When the switch SW1 is made conductive (e.g., in the present embodiment, when the operating temperature of the IGBT 21 is low), a lowest voltage may be applied to the non-inverting input terminal of the differential amplifier 351 by virtue of the resistor divider circuit composed of the resistors R2 to R4. When the second switch SW2 is made conductive (e.g., in the present embodiment, when the operating temperature of the IGBT 21 is high), a highest voltage may be applied to the non-inverting input terminal of the differential amplifier 351. When the third switch SW3 is made conductive (e.g., in the present embodiment, when the operating temperature of the IGBT 21 is in the middle of the temperature ranges), a voltage in the middle of the lowest voltage and the highest voltage may be applied to the non-inverting input terminal of the differential amplifier 351. Resistance values of the resistors R2 to R4 may be appropriately set for achieving desired resistor voltage divider effects.

The gate drive circuit 35 drives the gate of the IGBT 21 based on the control signal InX. The gate drive circuit 35 changes magnitude of current which drives the IGBT 21 in response to the operating temperature of the IGBT 21, and thereby adjusts driving capability of the IGBT 21. The gate drive circuit 35 may have the differential amplifier 351, MOSFETs 352 and 354 for turn-on, a MOSFET 353 for turn-off, a power supply VCC, P type MOSFETs 355 and 356 which form a current mirror circuit 357 upon being connected to the power supply VCC, and a resistor R6.

The non-inverting input terminal of the differential amplifier 351 may be connected to an output terminal of the switch unit 34, and an inverting input terminal of the differential amplifier 351 may be connected to the ground line G through the resistor R6 and thereby grounded. The output terminal of the differential amplifier 351 may be connected to a gate of the MOSFET 352 for turn-on. In this way, the differential amplifier 351 may amplify output voltage from the switch unit 34 and supply the output voltage to the gate of the MOSFET 352. The MOSFET 352 may be of N type, and its drain may be connected to the power supply VCC through the current mirror circuit 357, and its source may be grounded through the resistor R6 and the ground line G. An input end of the current mirror circuit 357 may be connected to the drain of the MOSFET 352 for turn-on, and an output terminal of current mirror circuit 357 may be connected to the gate of the IGBT 21. In this way, the gate of the MOSFET 352 may be driven by voltage output from the switch unit 34 and then amplified by the differential amplifier 351, and a constant current according to this voltage may flow from the current mirror circuit 357 into the gate of the IGBT 21. The current that flows into the gate of the IGBT 21 may increase as the voltage across the diode 22 becomes larger, i.e., as the operating temperature of the IGBT 21 becomes lower, and may decrease as the voltage across the diode 22 becomes smaller, i.e., as the operating temperature of the IGBT 21 becomes higher.

The gate of the MOSFET 352 may be connected to a drain of the MOSFET 354 for turn-on. A source of the MOSFET 354 for turn-on may be grounded through the ground line G, and a gate of the MOSFET 354 may be connected to the signal line S. In this way, the MOSFET 354 is turned on upon an H level control signal InX being supplied to the gate of the MOSFET 354 through the signal line S, which causes a gate voltage of the MOSFET 352 to be lowered and thus the MOSFET 352 is turned off. On the other hand, the MOSFET 354 is turned off upon a L level control signal InX being supplied to the gate of the MOSFET 354 through the signal line S, which results in the MOSFET 352 being turned on by means of voltage supplied from the differential amplifier 351, and the IGBT 21 being turned on by a constant current that flows from the current mirror circuit 357 to the gate of the IGBT 21.

The MOSFET 353 for turn-off may be of N type. The MOSFET 353 for turn-off may be connected to the power supply VCC through the current mirror circuit 357 as well as being connected to the gate of the IGBT 21. A source of the MOSFET 353 may be grounded through the ground line G. A gate of the MOSFET 353 may be connected to the signal line S. In this way, the MOSFET 353 is turned on upon an H level control signal InX being supplied to the gate of the MOSFET 353 through the signal line S, which causes charges accumulated at the gate of the IGBT 21 to be withdrawn and thus the IGBT 21 is turned off. On the other hand, the MOSFET 353 is turned off upon a L level control signal InX being applied to the gate of the MOSFET 353 through the signal line S, which disconnects conduction between the gate of the IGBT 21 and ground. Note that, because the control signal InX supplied to the gate of the MOSFET 353 and the control signal InX supplied to the above-described latch circuit 32 are the same, a timing at which the IGBT 21 is turned off and a timing when the latch circuit 32 latches a signal representing an operating temperature of the IGBT 21 may substantially match. The above gate drive circuit 35 may be one of those described in Patent Document 1 or 2 described above.

Operations

Next, operations of such a semiconductor apparatus 1 described above will be described while focusing on operations of the selection circuit 33 and the latch circuit 32.

In the temperature detection unit 31, the voltage across the diode 22 is applied to the inverting input terminals of the first comparator 311 and the second comparator 312. The voltage across the diode 22 may be a voltage according to the operating temperature of the IGBT 21. In this way, the first comparator 311 and the second comparator 312 may output signals according to high/low temperatures determined according to the operating temperature of the IGBT 21 and voltage values from the reference voltage sources Vref1 and Vref2. An output signal from the first comparator 311 and an output signal from the second comparator 312 may be respectively input to the low-temperature side input end L and the high-temperature side input end H of the latch circuit 32 through the first filter circuit 313 and the second filter circuit 314.

In response to the control signal InX which causes the IGBT 21 to be turn off (e.g., in the present embodiment, the H level signal) being supplied from the external control circuit 4, the latch circuit 32 captures input signals input to the low-temperature side input end L and the high-temperature side input end H, and retains levels of the input signals. The latch circuit 32 outputs the signal of different levels retained inside the latch circuit 32 from the low-temperature side output end TL and the high-temperature side output end TH.

The selection circuit 33 outputs an H level signal from any of the output ends VH, VM, or VL to the switch unit 34 in response to a combination of signal levels output from the low-temperature side output end TL and the high-temperature side output end TH of the latch circuit 32.

The switch unit 34 causes any of the switches SW1 to SW3 to be conductive in response to the signal supplied form the selection circuit 33, and applies voltage according to the switch that is made conductive to the differential amplifier 351 of the gate drive circuit 35. In this way, a voltage value selected by the selection circuit 33 and the switch unit 34 in response to the operating temperature of the IGBT 21 is amplified by the differential amplifier 351, and then applied to the MOSFET 352.

In response to the control signal InX which turns off the IGBT 21 (e.g., in the present embodiment, the H level signal) being supplied from the control circuit 4, the MOSFET 353 is turned on in the gate drive circuit 35 and causes gate charges of the IGBT 21 to be withdrawn, and thus the IGBT 21 is turned off. In addition, the MOSFET 354 is turned on and causes a gate voltage of the MOSFET 352 to be lowered, and thus the MOSFET 352 is turned off. Then, as a result of the MOSFET 354 being turned off in response to a control signal InX which turns on the IGBT 21 (e.g., in the present embodiment, a L level signal) being supplied from the control circuit 4, the MOSFET 352 is turned on by means of voltage applied from the differential amplifier 351, which causes a constant current to flow from the current mirror circuit 357 to the gate of the IGBT 21, and thus the IGBT 21 is turned on.

According to the above semiconductor apparatus 1, since magnitude of current which drives the IGBT 21 is changed in response to an operating temperature of the IGBT 21, switch noises of the IGBT 21, e.g., noises at a time of turn-on can be reduced. However, if the magnitude of current which drives the IGBT 21 is changed in response to the operating temperature, a length of a turn-on period of the IGBT 21 is changed, which may prevent desired operation waveforms from being obtained. Particularly, if different IGBTs 21 are used for every phase of AC power in order to convert power, AC power waveforms may vary between every phase. Even if the magnitude of current which drives the IGBT 21 is unchanged according to the operating temperature, if there are variations in operation characteristics between one IGBT 21 to another, lengths of turn-on periods of the IGBTs 21 may vary from one to another, which may prevent desired operation waveforms from being obtained. In order to improve such problems, variations in turn-on periods are reduced in a semiconductor apparatus 1A in a second embodiment (to be described below).

Figure 2:
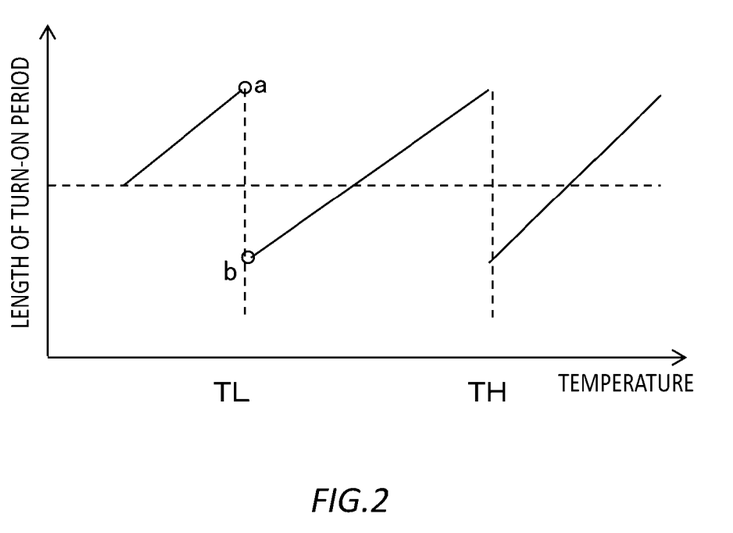
FIG. 2 illustrates relationship between operating temperatures and lengths of turn-on periods of an IGBT 21 in the semiconductor apparatus 1.

FIG. 2 illustrates relationship between an operating temperature and a length of a turn-on period of the IGBT 21 in the semiconductor apparatus 1. A vertical axis in this drawing represents the length of the turn-on period, and a horizontal axis represents the operating temperature of the IGBT 21. In this drawing, a temperature TL may be an upper limit temperature for the cold region covered by the first comparator 311, and a temperature TH may be a lower limit temperature for the hot region covered by the second comparator 312. In the semiconductor apparatus 1 according to the present embodiment, because the magnitude of driving current of the IGBT 21 is switched at the operating temperatures TL and TH of the IGBT 21, the turn-on period may be discontinuously changed before and after the operating temperatures TL and TH. For example, in this drawing, the turn-on period discontinues between a point a where an operating temperature is lower than the temperature TL and a point b where an operating temperature is higher than the temperature TL.

Figure 3:
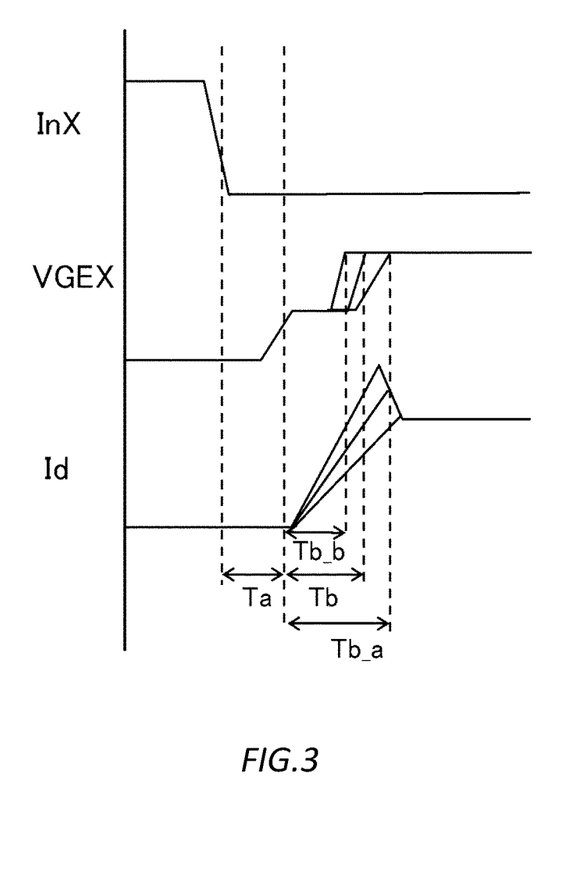
FIG. 3 illustrates variations in a turn-on period.

FIG. 3 illustrates variations in a turn-on period. In this drawing, a vertical axis represents a control signal InX supplied from the control circuit 4 to the drive apparatus 3, a drive signal (herein, a gate voltage) VGEX supplied from the gate drive circuit 35 to the IGBT 21, and a drain current Id of the IGBT 21, and a horizontal axis represents time. Also, in this drawing, a period Ta represents a time lag in the turn-on period, from a timing when the control signal InX exceeded a reference value and was changed until a timing when the drive signal VGEX started being changed. In this drawing, a period Tb represents a standard period in the turn-on period, from the timing when the drive signal VGEX started being changed until the IGBT is brought to a steady ON state, and a period Tb_a and a period Tb_b respectively represent periods corresponding to the points a and b in FIG. 2. In the semiconductor apparatus 1, the turn-on period may vary mainly due to the period Tb varies in response to the operating temperature of the IGBT 21.

Second Embodiment

Figure 4:
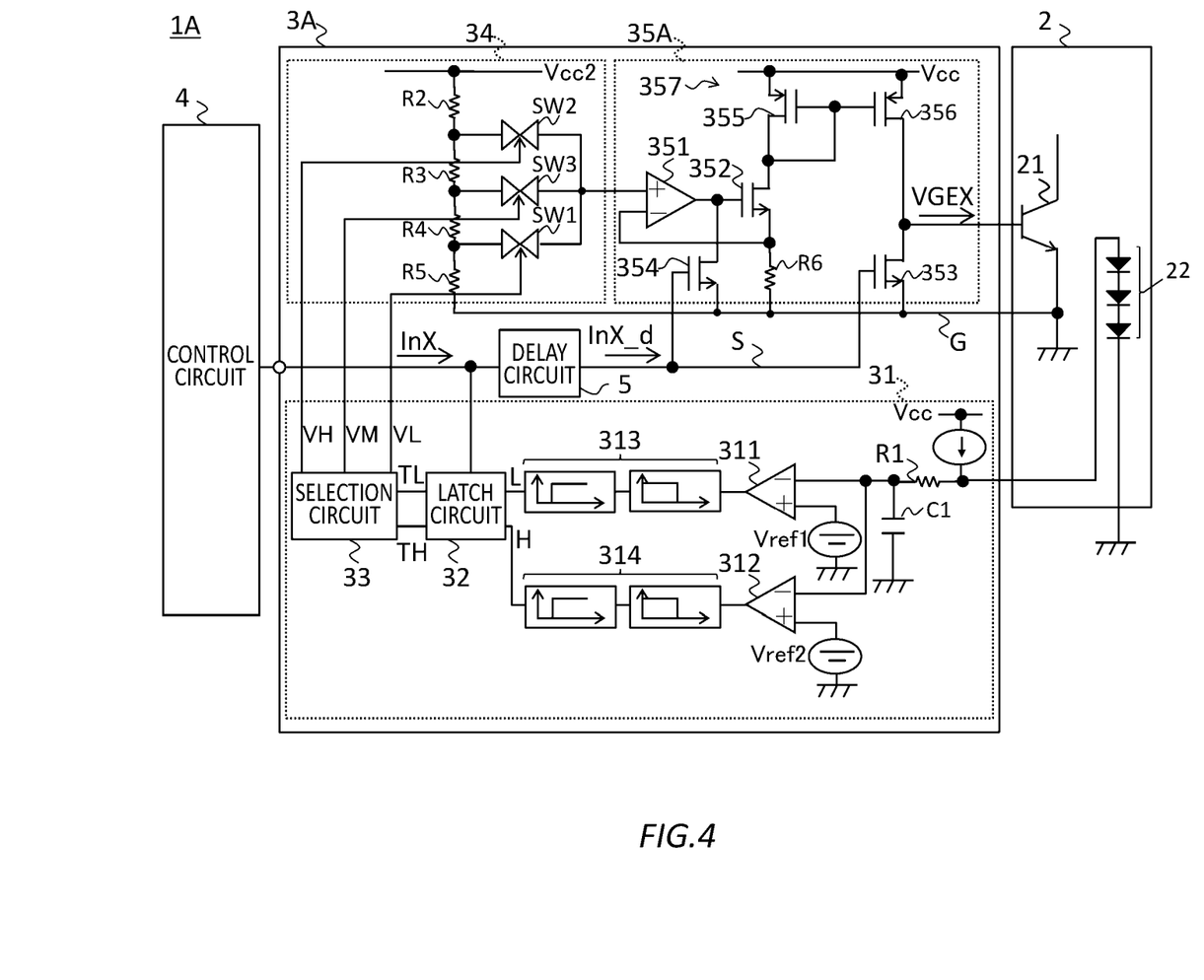
FIG. 4 illustrates a semiconductor apparatus 1A according to a second embodiment.

FIG. 4 illustrates the semiconductor apparatus 1A according to the second embodiment. The semiconductor apparatus 1A in the present embodiment includes a drive apparatus 3A. The drive apparatus 3A has a delay circuit 5 which delays and outputs a control signal InX to a gate drive circuit 35A for driving an IGBT 21, and the gate drive circuit 35A which drives a gate of the IGBT 21 based on the control signal InX_d delayed by the delay circuit 5. Architecture of the gate drive circuit 35A may be the same as that of the gate drive circuit 35 in the embodiment described above.

The delay circuit 5 may be provided on a signal line S between a control circuit 4 and the gate drive circuit 35A. Note that, a latch circuit 32 may be connected to the signal line S between the delay circuit 5 and the control circuit 4, or between the delay circuit 5 and the gate drive circuit 35A.

Figure 5:
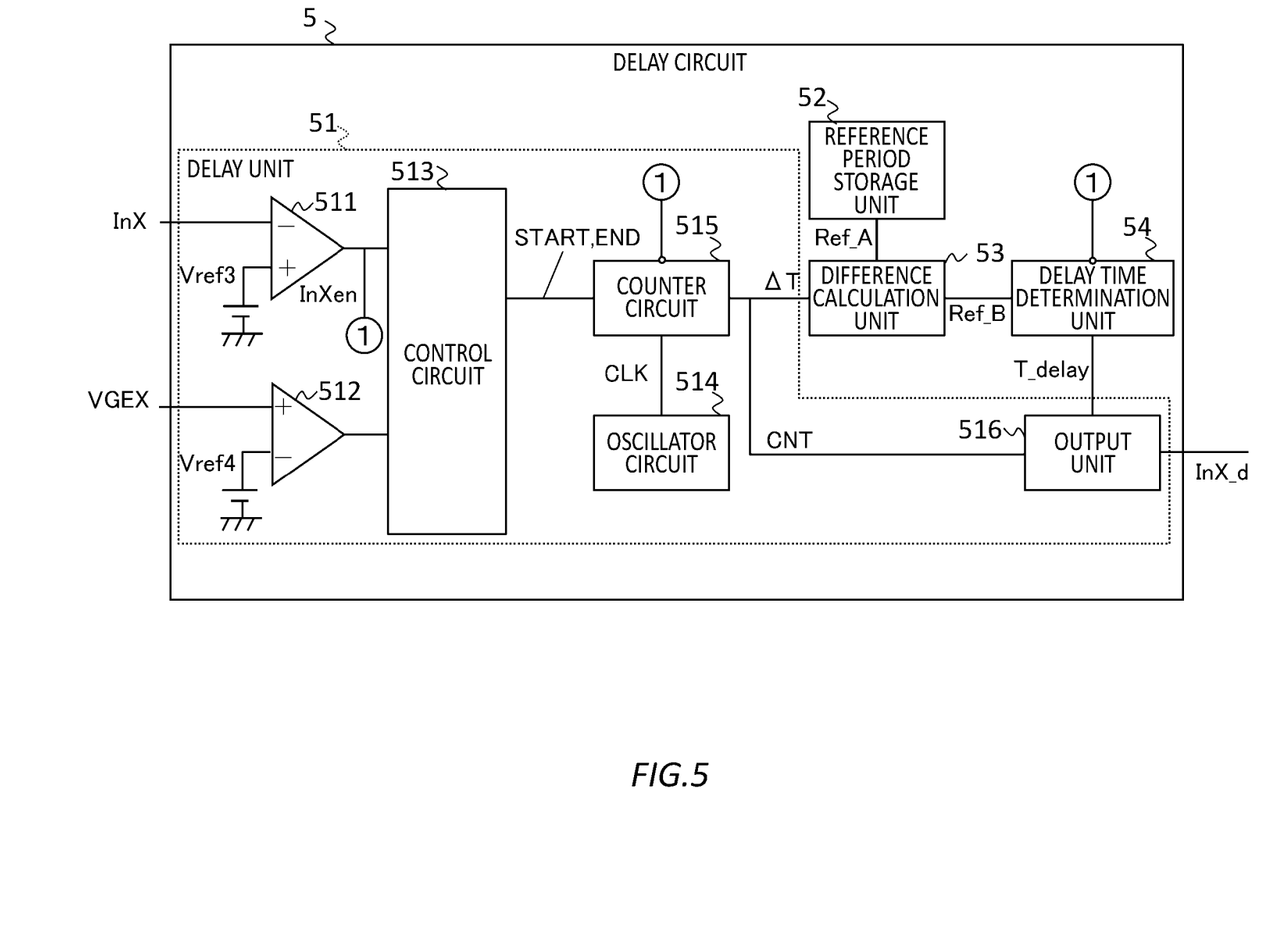
FIG. 5 illustrates a delay circuit 5.

FIG. 5 illustrates the delay circuit 5. The delay circuit 5 has a delay unit 51, a reference period storage unit 52, a difference calculation unit 53, and a delay time determination unit 54.

The delay unit 51 delays a control signal InX such that a time lag ΔT between a timing of change in the control signal InX and a timing of change in a drive signal VGEX is brought closer to a predetermined reference period Ref_A. The reference period Ref_A may be a period of time according to an ideal length for a turn-on period of the IGBT 21, which may be set to any period of time. The delay unit 51 may delay the control signal InX by a delay time T_delay (to be described below). The delay unit 51 may delay the timing of change (e.g., in the present embodiment, a timing of change to fall) in a control signal InX that is for turning on the IGBT 21, and may not delay the timing of change in a control signal InX that is for turning off the IGBT 21. The delay unit 51 has a first detection unit 511, a second detection unit 512, a control circuit 513, an oscillator circuit 514, a counter circuit 515, and an output unit 516.

The first detection unit 511 detects the timing of change in the control signal InX that is for turning on the IGBT 21. Because the control signal InX according to the present embodiment instructs turn-on of the IGBT 21 by falling to a L level, the first detection unit 511 may detect the timing of change in when the control signal InX falls to the L level. The first detection unit 511 may detect a timing when the control signal InX is changed across a threshold value, or may detect a timing when the control signal InX reaches the threshold value. The first detection unit 511 may include a comparator of which a non-inverting input terminal is input with a reference voltage Vref3, and of which an inverting input terminal is input with the control signal InX. The first detection unit 511 may supply the control circuit 513, the counter circuit 515, and the delay time determination unit 54 with a signal (also referred to as a signal InXen) which turns into an H level in response to the control signal InX being lower than the reference voltage Vref3, and turns into a L level in response to the control signal InX being larger than the reference voltage Vref3. The reference voltage Vref3 may be set to an any value between a L level signal value and an H level signal value of the control signal InX.

The second detection unit 512 detects the timing of change in the drive signal VGEX in a turn-on period of the IGBT 21. The turn-on period of the IGBT 21 may be a period from the timing of change in the control signal InX that is for turning on the IGBT 21 until the IGBT 21 is brought to an ON state, e.g., in the present embodiment, a period from the timing of the fall of the control signal InX until collector current of the IGBT 21 reaches 90% of that in an steady ON state. The drive signal VGEX may be a voltage signal supplied from the gate drive circuit 35A to a gate of the IGBT 21, which may also be a gate voltage of the IGBT 21.

In the turn-on period of the IGBT 21 according to the present embodiment, because the drive signal VGEX rises from a L level to an H level in order to turn on the IGBT 21 the second detection unit 512 may detect a timing of change in when the drive signal VGEX rises to the H level. The second detection unit 512 may detect any timing of change which can be detected in the turn-on period. The second detection unit 512 may detect a timing when the drive signal VGEX is changed across a threshold value, or may detect a timing when the drive signal VGEX reaches the threshold value. The second detection unit 512 may include a comparator of which an inverting input terminal is input with a reference voltage Vref4, and of which a non-inverting input terminal is input with the drive signal VGEX. The second detection unit 512 may supply the control circuit 513 with a signal which turns into an H level in response to the drive signal VGEX being larger than the reference voltage Vref4, and turns into a L level in response to the drive signal VGEX being lower than the reference voltage Vref4. The reference voltage Vref4 may be set to an any value between a L level signal value and an H level signal value of the drive signal VGEX. By way of example, the reference voltage Vref4 may be set to a threshold voltage or Miller voltage of the IGBT 21.

The control circuit 513 may output a START signal which rises in response to the signal from the first detection unit 511 turning into the H level, and an END signal which rises in response to the signal from the second detection unit 512 turning into H level. The control circuit 513 may supply the counter circuit 515 with the START signal and the END signal.

By way of example, in the present embodiment, the START signal will be described as a pulse signal which falls immediately after rising, whereas the START signal can also be a signal which rises in response to the signal from the first detection unit 511 turning into an H level, and falls in response to the signal from the first detection unit 511 turning into a L level. Similarly, the END signal will be described as a pulse signal which falls immediately after rising, whereas the END signal can also be a signal which rises in response to the signal from the second detection unit 512 turning into an H level, and falls in response to the signal from the second detection unit 512 turning into a L level.

The oscillator circuit 514 outputs a clock signal CLK. The oscillator circuit 514 may supply the counter circuit 515 with the clock signal CLK.

The counter circuit 515 counts at least one of a rise or fall in the clock signal. The counter circuit 515 may start the count in response to the START signal from the control circuit 513 rising, and end the count in response to the END signal rising. A counted value CNT at the end of the counting performed by the counter circuit 515 may represent the time lag ΔT between the timing of change in the control signal InX and the timing of change in the drive signal VGEX, e.g., in the present embodiment, representing a gap from the timing of change in the control signal InX going below the reference voltage Vref3 until the timing of change in the drive signal VGEX going over the reference voltage Vref4. The counter circuit 515 may supply, in response to the END signal being supplied, the difference calculation unit 53 with the counted value CNT at that point of time, i.e., the counted value CNT representing the time lag ΔT. In addition to this, the counter circuit 515 may sequentially supply the output unit 516 with the counted value CNT. By way of example, the counter circuit 515 may be an 8-bit counter. The counter circuit 515 may be reset in response to the signal InXen from the first detection unit 511 falling.

The output unit 516 outputs the control signal InX_d that is obtained by delaying the control signal InX to the gate drive circuit 35A. The control signal InX_d may be a signal obtained by delaying the timing of change in the control signal InX that is for turning on the IGBT 21 (e.g., in the present embodiment, the timing of change in falling). The control signal InX_d may be the signal obtained by delaying the control signal InX such that the time lag ΔT is brought closer to the predetermined reference period Ref_A.

The output unit 516 may obtain the delay time T_delay (e.g., in the present embodiment, a counted value of the clock signals CLK corresponding to a time duration of the delay time T_delay) that is determined by the delay time determination unit 54 (to be described below). After the fall in the control signal InX for turning on the IGBT 21, the counted value CNT is sequentially supplied from the counter circuit 515, and in response to the counted value CNT reaching the delay time T_delay, the output unit 516 may cause the control signal InX_d to fall. In this way, the fall in the control signal InX may be delayed until the counted value CNT reaches the delay time T_delay, i.e., delayed by the delay time T_delay, and then output as a fall in the control signal InX_d.

The reference period storage unit 52 stores the reference period Ref_A. By way of example, in the present embodiment, the reference period storage unit 52 may store as the reference period Ref_A, a counted value of the clock signal CLK that corresponds to a time duration of this reference period Ref_A, i.e., a value obtained by dividing the time duration of the reference period Ref_A by a clock frequency of the oscillator circuit 514. The reference period Ref_A stored in the reference period storage unit 52 may be supplied to the difference calculation unit 53.

The difference calculation unit 53 calculates a difference Ref_B between the reference period Ref_A and the time lag ΔT. The difference calculation unit 53 may calculate the difference Ref_B by deducting the time lag ΔT (e.g. in the present embodiment, a counted value corresponding to a time duration of the time lag ΔT) from the reference period Ref_A stored in the reference period storage unit 52 (e.g., in the present embodiment, the counted value corresponding to the time duration of the reference period Ref_A). The difference calculation unit 53 may supply the delay time determination unit 54 with the calculated difference Ref_B.

The delay time determination unit 54 determines the delay time T_delay for the control signal InX to be delayed by, based on the difference Ref_B. The delay time determination unit 54 may determine the delay time T_delay that is new by deducting, from the delay time T_delay that has been determined, a value according to a difference Ref_B that is newly calculated by the difference calculation unit 53. By way of example, in the present embodiment, the delay time determination unit 54 may determine the delay time T_delay that is new by deducting, from the delay time T_delay that has been determined, the difference Ref_B itself that is newly calculated by the difference calculation unit 53. The delay time T_delay that has been determined may be a delay time T_delay that was determined in a previous switching cycle of the IGBT 21. By determining the delay time T_delay in this manner, in the switching cycle that is new, the control signal InX will be delayed such that the difference Ref_B between the reference period Ref_A and the time lag ΔT will be reduced, i.e., the time lag ΔT will be brought closer the reference period Ref_A by the delay unit 51.

The delay time determination unit 54 may determine as the delay time T_delay, a counted value of the clock signals CLK corresponding to the time duration of this delay time T_delay, i.e., a value obtained by dividing the time duration of the delay time T_delay by a clock frequency of the oscillator circuit 514. The delay time determination unit 54 may store and accumulate the delay time T_delay that has been determined, and determine the delay time T_delay that is new by using the delay time T_delay that has been determined. The determined delay time T_delay may be used by the delay unit 51 to delay the control signal InX in a subsequent switching cycle. The delay time determination unit 54 may supply the output unit 516 of the delay unit 51 with the determined delay time T_delay.

According to the above delay circuit 5, the time lag ΔT from a timing of change in the control signal InX until a timing of change in the drive signal VGEX is brought closer to the reference period Ref_A by delaying the control signal InX such that the time lag ΔT that is from the timing of change in the control signal InX for the gate drive circuit 35A until the timing of change in the drive signal VGEX supplied to the gate of the IGBT 21 is brought closer to the reference period Ref_A, and outputting the control signal InX to the gate drive circuit 35A. Therefore, even if there are variations in operation characteristics between one IGBT 21 to another, or even when driving current of an IGBT 21 is changed depending on an operating temperature of the IGBT 21, a switching period can be brought closer to a constant time and thereby desired operation waveforms can be obtained.

Further, since the delay time T_delay is determined based on the difference Ref_B between the reference period Ref_A and the time lag ΔT, and the control signal InX is delayed by the delay time T_delay that has been determined, it is possible to ensure that the time lag ΔT is brought closer to the reference period Ref_A.

Furthermore, since the delay time T_delay that is new is determined by deducting, from the delay time T_delay that has been determined, a value according to the difference Ref_B that is new, the delay time T_delay is determined so as to make the difference Ref_B small. Therefore, it is possible to further ensure that the time lag ΔT is brought closer to the reference period Ref_A.

In addition, since the delay time T_delay that is new is determined by deducting, from the delay time T_delay that has been determined, the difference Ref_B itself that is new, the delay time T_delay is determined so as to eliminate the difference Ref_B. Therefore, it is possible to further ensure that the time lag ΔT is brought closer to the reference period Ref_A.

In addition, since the timing of change in the control signal InX that is for turning on the IGBT 21 is delayed, a turn-on period of the IGBT 21 can be brought closer to a constant time and thereby desired operation waveforms can be obtained.

Figure 6:
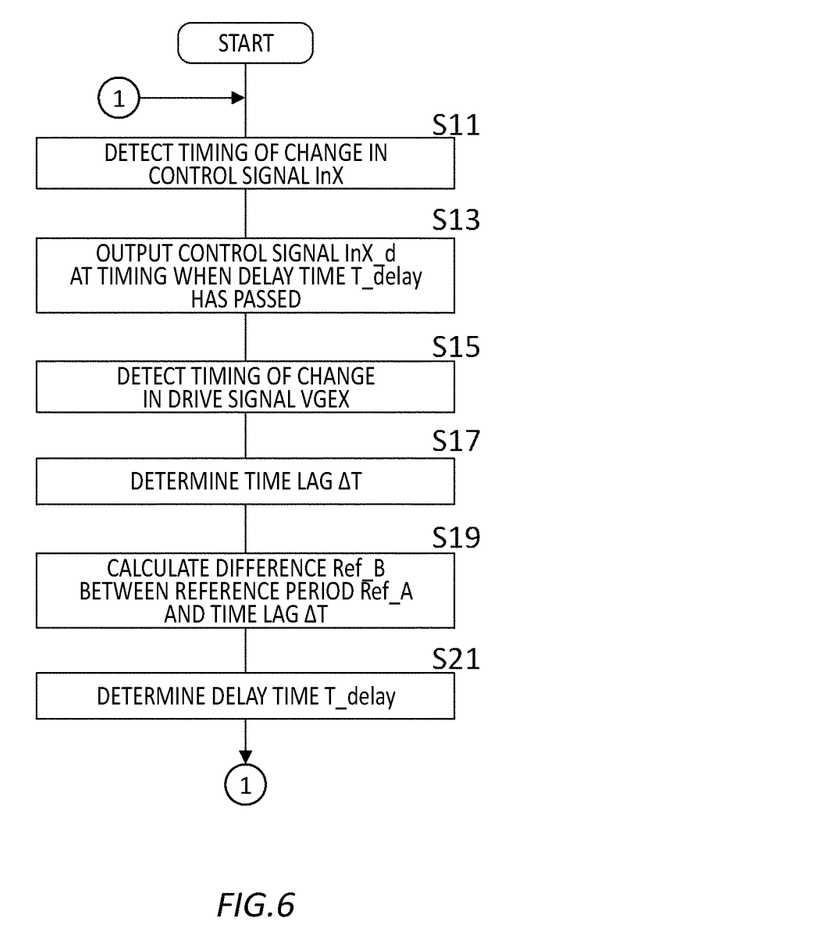
FIG. 6 illustrates operations of the delay circuit 5.

FIG. 6 illustrates operations of the delay circuit 5. The delay circuit 5 delays the control signal InX by performing processing in steps S11 to S21, and outputs the control signal InX to the gate drive circuit 35A of the IGBT 21.

In step S11, the first detection unit 511 detects a timing of change in the control signal InX. The first detection unit 511 may detect the timing of change for turning on the IGBT 21. By way of example, in the present embodiment, the first detection unit 511 may detect a timing of change in when the control signal InX becomes lower than the reference voltage Vref3.

Then, in steps S13 to S21, the delay circuit 5 delays the control signal InX such that a time lag ΔT between the timing of change in the control signal InX and a timing of change in the drive signal VGEX is brought closer to the reference period Ref_A. That is, in step S13, the output unit 516 changes the control signal InX_d at a timing when a delay time T_delay that has been already determined by the delay time determination unit 54 in step S21 (to be described below) has passed since the timing of change detected in step S11. In this way, the gate drive circuit 35A drives the IGBT 21 based on the control signal InX_d that has been delayed. If step S21 has never been performed and thus the delay time T_delay has not been determined, the output unit 516 may use an initial value that has been preset as the delay time T_delay.

In step S15, the second detection unit 512 detects the timing of change in the drive signal VGEX. The second detection unit 512 may detect the timing of change in the drive signal VGEX in a turn-on period of the IGBT 21. By way of example, in the present embodiment, the second detection unit 512 may detect a timing of change when the drive signal VGEX becomes larger than the reference voltage Vref4.

In step S17, the counter circuit 515 detects the time lag ΔT between the timing of change in the control signal InX that has been detected in step S11 and the timing of change in the drive signal VGEX that has been detected in step S15.

In step S19, the difference calculation unit 53 calculates the difference Ref_B between the reference period Ref_A that has been predetermined and the time lag ΔT.

In step S21, the delay time determination unit 54 newly determines the delay time T_delay based on the difference Ref_B. The delay time determination unit 54 may determine the delay time T_delay that is new by deducting the difference Ref_B itself that has been newly calculated in step S19 from the delay time T_delay that has been determined in a last step S21. When the processing in step S21 ends, processing of the operations may proceed to step S11 described above.

Figure 7:
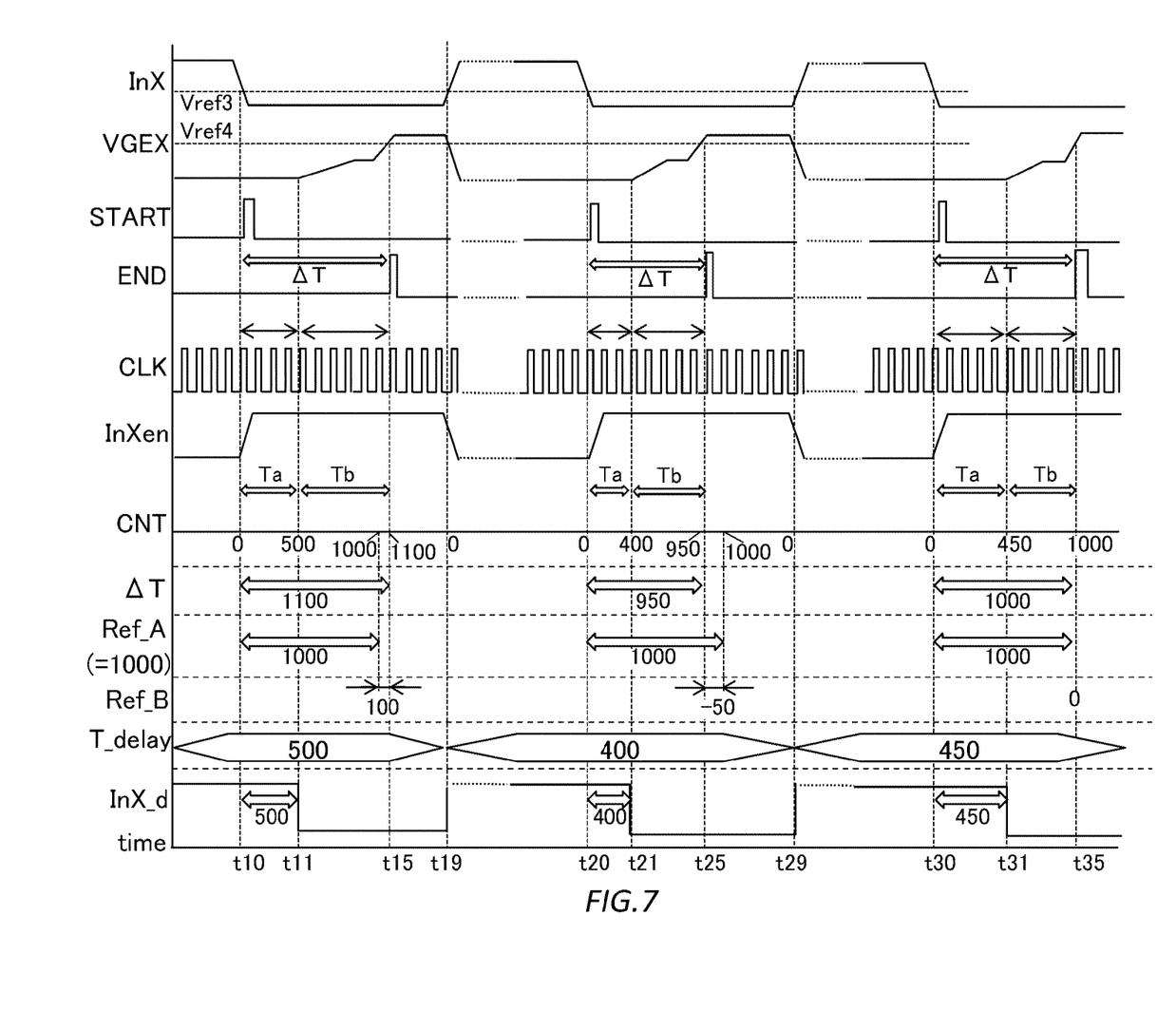
FIG. 7 illustrates operation waveforms of a drive apparatus 3.

FIG. 7 illustrates operation waveforms of the drive apparatus 3. In this drawing, an vertical axis represents the control signal InX, the drive signal VGEX, the START signal, the END signal, the clock signal CLK, the signal InXen and the control signal InX_d, and a horizontal axis represents times, counted values, time lags ΔT, reference periods Ref_A, differences Ref_B, delay times T_delay, etc.

Once the first detection unit 511 detects that a control signal InX falls and becomes lower than a threshold voltage Vref3 at time t10, a START signal is output from the control circuit 513 and the counter circuit 515 starts counting.

Once a counted value becomes 500 at time t11 and reaches a delay time T_delay (here, 500) that has been already determined, the output unit 516 causes a control signal InX_d to fall. Accordingly, the control signal InX for turning on the IGBT 21 is delayed to change, which results in a change in the control signal InX_d that is output and causes the gate drive circuit 35A to start a turn-on operation of the IGBT 21.

Once the second detection unit 512 detects that a drive signal VGEX becomes higher than a threshold voltage Vref4 at time t15, an END signal is output from the control circuit 513 and the counter circuit 515 ends counting, then a counted value (here, 1100) representing a time lag ΔT from time t10 until time t15 is output. Accordingly, the difference calculation unit 53 calculates a difference Ref_B (here, 100) between the reference period Ref_A (in the present example of operation, 1000) and the time lag ΔT (here, 1100). Also, the delay time T_delay that is new (here, 400) is determined by deducting, from the delay time T_delay (here, 500) that has been determined, the difference Ref_B (here, 100). Note that, the IGBT 21 may be turned into an ON state at any point of time from time t11 to time t19 (to be described below).

In response to the control signal InX rising at time t19, the counter circuit 515 is reset. Also, the output unit 516 causes the control signal InX_d to rise. Accordingly, the gate drive circuit 35A starts a turn-off operation for the IGBT 21. The IGBT 21 may be turned into an OFF state at any point of time from time t19 to time t20 (to be described below).

Similarly, once the first detection unit 511 detects that the control signal InX falls and becomes lower than the threshold voltage Vref3 at time t20, a START signal is output from the control circuit 513 and the counter circuit 515 starts counting.

Once a counted value becomes 400 at time t21 and reaches the delay time T_delay (here, 400) that has been already determined, the output unit 516 causes the control signal InX_d to fall. Accordingly, the control signal InX for turning on the IGBT 21 is delayed to change, which results in a change in the control signal InX_d that is output and causes the gate drive circuit 35A to start a turn-on operation of the IGBT 21.

Once the second detection unit 512 detects that the drive signal VGEX becomes higher than the threshold voltage Vref4 at time t25, an END signal is output from the control circuit 513 and the counter circuit 515 ends counting, then a counted value (here, 950) representing a time lag ΔT from time t20 until time t25 is output. Accordingly, the difference calculation unit 53 calculates a difference Ref_B (here, −50) between the reference period Ref_A (in the present example of operation, 1000) and the time lag ΔT (here, 950). Also, the delay time T_delay that is new (here, 450) is determined by deducting, from the delay time T_delay (here, 400) that has been determined, the difference Ref_B (here, −50). Note that, the IGBT 21 may be turned into an ON state at any point of time from time t21 to time t29 (to be described below).

In response to the control signal InX rising at time t29, the counter circuit 515 is reset. Also, the output unit 516 causes the control signal InX_d to rise. Accordingly, the gate drive circuit 35A starts a turn-off operation for the IGBT 21. The IGBT 21 may be turned into an OFF state at any point of time from time t29 to time t30 (to be described below).

Similarly, once the first detection unit 511 detects that the control signal InX falls and becomes lower than the threshold voltage Vref3 at time t30, a START signal is output from the control circuit 513 and the counter circuit 515 starts counting.

Once a counted value becomes 450 at time t31 and reaches the delay time T_delay (here, 450) that has been already determined, the output unit 516 causes the control signal InX_d to fall. Accordingly, the control signal InX for turning on the IGBT 21 is delayed to change, which results in a change in the control signal InX_d that is output and causes the gate drive circuit 35A to start a turn-on operation of the IGBT 21.

Once the second detection unit 512 detects that the drive signal VGEX becomes higher than the threshold voltage Vref4 at time t35, an END signal is output from the control circuit 513 and the counter circuit 515 ends counting, then a counted value (here, 1000) representing a time lag ΔT from time t30 until time t35 is output. Accordingly, the difference calculation unit 53 calculates a difference Ref_B (here, 0) between the reference period Ref_A (in the present example of operation, 1000) and the time lag ΔT (here, 1000). Also, the delay time T_delay that is new (here, 450) is determined by deducting, from the delay time T_delay (here, 450) that has been determined, the difference Ref_B (here, 0). Note that, the IGBT 21 may be turned into an ON state at any point of time after time t31.

It should be noted that, while it has been described that the delay time T_delay is determined by the delay time determination unit 54 every time when the IGBT 21 is turned on in the above-described embodiment, the delay time T_delay may be determined every time when turn-ons are performed for a reference number of times of more than one. In this case, the delay time determination unit 54 may determine the delay time T_delay based upon a time lag ΔT detected in one turn-on period (e.g., one most recent turn-on period), or may determine the delay time T_delay based upon an average value of time lags ΔT detected in multiple turn-on periods (e.g., in the most recent multiple turn-on periods).

Moreover, while it has been described that the delay time determination unit 54 determines the delay time T_delay that is new by deducting, from the delay time T_delay that has been determined, the difference Ref_B itself that is newly calculated by the difference calculation unit 53, the delay time determination unit 54 may determine the delay time T_delay that is new by means of another technique. For example, the delay time determination unit 54 may determine the delay time T_delay that is new by deducting, from the delay time T_delay that has been determined, a time obtained by dividing the difference Ref_B that is newly calculated by the difference calculation unit 53 by a fixed value of more than one. By way of example, the delay time determination unit 54 may determine the delay time T_delay by: (delay time T_delay that is new)=(delay time T_delay that has been determined)−(difference Ref_B)/2. In this way, the delay time T_delay can be prevented from greatly changing between one switching to another.

Furthermore, while it has been described that the delay time determination unit 54 determines the delay time T_delay that is new by deducting, from the delay time T_delay that has been determined, the value according to the difference Ref_B that is new, the delay time determination unit 54 may determine the delay time T_delay that is new by means of another technique. For example, in response to the difference Ref_B being positive, the delay time determination unit 54 may determine the delay time T_delay that is new by decreasing the delay time T_delay that has been determined by a fixed time, and in response to the difference Ref_B being negative, the delay time determination unit 54 may determine the new delay time T_delay by increasing the delay time T_delay that has been determined by a fixed time. The fixed time may be any length of time. In this case, the delay time T_delay can be prevented from greatly changing from one switching to another.

Furthermore, while it has been described that the delay circuit 5 delays the timing of change in the control signal InX that is for turning on the IGBT 21, the delay circuit 5 may delay the timing of change in the control signal InX that is for turning off the IGBT 21 in addition to this or instead of this.

Furthermore, while it has been described that the delay circuit 5 has the reference period storage unit 52, the difference calculation unit 53, and the delay time determination unit 54, the delay circuit 5 may not have any of these as long as the control signal InX is delayed by the delay unit 51 such that a time lag ΔT is brought closer to a reference period Ref_A. Furthermore, while it has been described that the delay unit 51 has the control circuit 513, the oscillator circuit 514, the counter circuit 515, and the output unit 516, the delay unit 51 may not have any of these.

Furthermore, while it has been described that the IGBT 21 is formed in the power semiconductor chip 2 together with the diode 22, the IGBT 21 may be formed apart from the diode 22.

Furthermore, while it has been described that the semiconductor device is the IGBT 21, the semiconductor device may be another semiconductor device such as a MOSFET.

Furthermore, while it has been described that the drive apparatus 3A has the temperature detection unit 31 and the switch unit 34, the drive apparatus 3A may not have any of these. In this case, the drive apparatus 3A may cause a driving current of the IGBT 21 to be constant regardless of an operating temperature of the IGBT 21.

While the present invention has been described by way of the embodiments, the technical scope of the present invention is not limited to the above-described embodiments. It is apparent to persons skilled in the art that various alterations or improvements can be made to the above-described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, specification, or drawings can be realized in any order as long as the order is not indicated by "prior to," "before," or the like and as long as the output from a previous process is not used in a later process. Even if the operation flow is described using phrases such as "first" or "next" in the claims, specification, or drawings for convenience, it does not necessarily mean that the process must be performed in this order.

EXPLANATION OF REFERENCES

1: semiconductor apparatus;
2: power semiconductor chip;
3: drive apparatus;
4: control circuit;
5: delay circuit;
21: IGBT;
22: diode;
31: temperature detection unit;
32: latch circuit;
33: selection circuit;
34: switch unit;
35: gate drive circuit;
51: delay unit;
52: reference period storage unit;
53: difference calculation unit;
54: delay time determination unit;
311: comparator;
312: comparator;
313: filter circuit;
314: filter circuit;
351: differential amplifier;
352: MOSFET;
353: MOSFET;
354: MOSFET;
355: P type MOSFET;
356: P type MOSFET;
357: current mirror circuit;
511: first detection unit;
512: second detection unit;
513: control circuit;
514: oscillator circuit;
515: counter circuit;
516: output unit.

What is claimed is:
1. A delay circuit which delays a control signal and outputs the control signal to a gate drive circuit of a semiconductor device, the delay circuit comprising:

a delay unit which delays the control signal such that a time lag between a timing of change in the control signal and a timing of change in a drive signal supplied from the gate drive circuit to a gate of the semiconductor device is brought closer to a predetermined reference period, wherein the time lag is due to a length of a turn-on period of the semiconductor device, wherein the turn-on period of the semiconductor device is based a magnitude of current which drives the gate of the semiconductor device, and wherein the magnitude of current which drives the gate of the semiconductor device is set based on an operating temperature of the semiconductor device.

2. The delay circuit according to claim 1, further comprising:

a difference calculation unit which calculates a difference between the reference period and the time lag; and a delay time determination unit which determines a delay time for the control signal to be delayed by, based on the difference, wherein the delay unit delays the control signal by the delay time.

3. The delay circuit according to claim 2, wherein the delay time determination unit determines the delay time that is new by deducting, from the delay time that has been determined, a value according to the difference that is newly calculated by the difference calculation unit.

4. The delay circuit according to claim 3, wherein the delay time determination unit determines the delay time that is new by deducting, from the delay time that has been determined, the difference that is newly calculated by the difference calculation unit.

5. The delay circuit according to claim 3, wherein the delay time determination unit determines the delay time that is new by deducting, from the delay time that has been determined, a time obtained by dividing the difference that is newly calculated by the difference calculation unit by a fixed value of more than one.

6. The delay circuit according to claim 2, wherein the delay time determination unit:

decreases the delay time that has been determined by a fixed time in response to the difference being positive; and increases the delay time that has been determined by a fixed time in response to the difference being negative.

7. The delay circuit according to claim 1, wherein the delay unit:

has a first detection unit which detects the timing of change in the control signal that is for turning on the semiconductor device;

has a second detection unit which detects the timing of change in the drive signal in the turn-on period of the semiconductor device; and delays the timing of change in the control signal that is for turning on the semiconductor device.

8. A drive apparatus comprising:

the delay circuit according to claim 1; and a gate drive circuit which drives a gate of a semiconductor device based on a control signal delayed by the delay circuit.

9. A drive apparatus comprising:

the delay circuit according to claim 2; and a gate drive circuit which drives a gate of a semiconductor device based on a control signal delayed by the delay circuit.

10. A drive apparatus comprising:

the delay circuit according to claim 3; and a gate drive circuit which drives a gate of a semiconductor device based on a control signal delayed by the delay circuit.

11. A drive apparatus comprising:

the delay circuit according to claim 4; and a gate drive circuit which drives a gate of a semiconductor device based on a control signal delayed by the delay circuit.

12. A drive apparatus comprising:

the delay circuit according to claim 5; and a gate drive circuit which drives a gate of a semiconductor device based on a control signal delayed by the delay circuit.

13. A drive apparatus comprising:

the delay circuit according to claim 6; and a gate drive circuit which drives a gate of a semiconductor device based on a control signal delayed by the delay circuit.

14. A drive apparatus comprising:

the delay circuit according to claim 7; and a gate drive circuit which drives a gate of a semiconductor device based on a control signal delayed by the delay circuit.

15. A semiconductor apparatus comprising:

the drive apparatus according to claim 8; and a semiconductor device driven by the gate drive circuit of the drive apparatus.

16. A semiconductor apparatus comprising:

the drive apparatus according to claim 9; and a semiconductor device driven by the gate drive circuit of the drive apparatus.

17. A semiconductor apparatus comprising:

the drive apparatus according to claim 10; and a semiconductor device driven by the gate drive circuit of the drive apparatus.

18. A semiconductor apparatus comprising:

the drive apparatus according to claim 11; and a semiconductor device driven by the gate drive circuit of the drive apparatus.

19. A semiconductor apparatus comprising:

the drive apparatus according to claim 12; and a semiconductor device driven by the gate drive circuit of the drive apparatus.

20. A delay method for delaying a control signal and outputting the control signal to a gate drive circuit of a semiconductor device, the delay method comprising:

delaying the control signal such that a time lag between a timing of change in the control signal and a timing of change in a drive signal supplied from the gate drive circuit to a gate of the semiconductor device is brought closer to a predetermined reference period, wherein the time lag is due to a length of a turn-on period of the semiconductor device, wherein the turn-on period of the semiconductor device is based a magnitude of current which drives the gate of the semiconductor device, and wherein the magnitude of current which drives the gate of the semiconductor device is set based on an operating temperature of the semiconductor device.

* * * * *